United States Patent
Rajeswaran et al.

(10) Patent No.: US 8,338,201 B2
(45) Date of Patent: Dec. 25, 2012

(54) METHOD OF MANUFACTURING ORGANIC LIGHTING DEVICE

(75) Inventors: Gopalan Rajeswaran, New Delhi (IN); Rajeev Jindal, New Delhi (IN); Subrata Dutta, New Delhi (IN)

(73) Assignee: Moser Baer India Limited, New Delhi (IN)

( * ) Notice: Subject to any disclaimer, the term of this patent is extended or adjusted under 35 U.S.C. 154(b) by 0 days.

(21) Appl. No.: 13/019,287

(22) Filed: Feb. 1, 2011

(65) Prior Publication Data
US 2011/0195533 A1   Aug. 11, 2011

(30) Foreign Application Priority Data
Feb. 8, 2010 (IN) .............................. 267/DEL/2010

(51) Int. Cl.
*H01L 21/00* (2006.01)

(52) U.S. Cl. ................ 438/30; 438/22; 438/24; 438/29; 438/E21.158

(58) Field of Classification Search .................... 438/22, 438/24, 32, 46–52, 29–30; 257/40, 47, 98–99
See application file for complete search history.

(56) References Cited

U.S. PATENT DOCUMENTS
7,888,686 B2 * 2/2011 Chik et al. ...................... 257/79
8,008,103 B2 * 8/2011 Cho et al. ........................ 438/42

* cited by examiner

*Primary Examiner* — Dung A. Le
(74) *Attorney, Agent, or Firm* — Antonio Papageorgiou; Ostrow Kaufman LLP

(57) ABSTRACT

A method of manufacturing an organic lighting device, having a form factor substantially equal to or less than 900 square centimeters, without involving a cutting process is provided. The method includes providing one or more first substrates with a size substantially equal to the form factor. Thereafter, the method includes a high throughput first processing of the one or more first substrates and active layer deposition processing on the one or more first substrates. Further, one or more second substrates having a size substantially equal or less than the form factor are provided. Thereafter, a high throughput second processing is performed on the one or more second substrates. Finally, the method includes encapsulating at least one of the one or more first substrates with at least one of the one or more second substrates to form the organic lighting device having the form factor.

20 Claims, 10 Drawing Sheets

METHOD OF MANUFACTURING ORGANIC LIGHTING DEVICE

INCORPORATION BY REFERENCE OF PRIORITY DOCUMENT

This application is based on, and claims the benefit of priority from Indian Patent Application No. 267/DEL/2010 entitled "METHOD OF MANUFACTURING ORGANIC LIGHTING DEVICE" which was filed on Feb. 8, 2010. The content of the aforementioned application is incorporated by reference herein.

FIELD OF THE INVENTION

The invention disclosed herein relates, in general, to a method of manufacturing organic light emitting devices. More specifically, the present invention relates to a method of manufacturing an organic light emitting device using high-throughput processes.

BACKGROUND

Organic light emitting devices (OLEDs) emit light in response to an electric current. The OLEDs usually include layers of semiconductor materials for carrying out this functionality. On application of a voltage across the layers of the semiconductor materials, electrons and holes are injected from electrodes placed on either side of the layers of the semiconductor materials. The electrons and holes recombine in the layers of the semiconductor materials and form excitons, thereby emitting light.

The OLEDs are increasingly becoming a popular technology for various applications including flat panel displays and lighting systems for illumination. The OLEDs are usually manufactured in large sizes using large substrate, i.e., manufacturing large substrate area products. The OLEDs are manufactured by employing various methods such as panel by panel, roll to roll and other such large form factor manufacturing processes.

Further, such large form factor manufacturing processes tend to increase defects and non-uniformities in various layers of the OLEDs because commonly used methods of layer deposition such as screen printing, dip coating, spray coating, doctored blade, spin coating, sputtering, evaporation etc are not suitable for large areas. For example spin coating when done on large substrate, gives variation in height of deposited layers from an inner periphery to an outer periphery. These defects lead to poor device performance and very low process yields for the OLEDs. Also, in manufacturing of large substrate area OLEDs, there are defects such as pinholes, inhomogeneity etc. in the layers deposited on the large substrate area OLEDs.

The large substrate area OLEDs have to be sliced to form organic light emitting devices of required product sizes, thereby causing area and material losses and increasing costs. Also, this process of slicing requires additional time thereby reducing yield. For example, for applications such as mobile phone displays, the large substrate area OLEDs will have to sliced into smaller sizes leading to a reduction in yield.

Furthermore, many of these manufacturing processes are not scalable leading to delays in faster commercialization for these devices. Therefore, the large substrate area OLEDs or smaller OLEDs manufactured by cutting the large substrate area OLEDs are poor in quality, inefficient and costly.

In light of the above, there is a need of a method of manufacturing OLEDs which overcomes one or more of the above mentioned problems and creates a process that can mass manufacture high quality OLEDs with high yield, using substrates having a small area.

SUMMARY

It is an objective of the present invention to provide a method of manufacturing an organic lighting device which minimizes the defects.

Another objective of the present invention is to provide a method of manufacturing an organic lighting device that does not involve cutting or slicing the substrate, increasing the yield, reducing the wastage of expensive material and thus lowering the costs of the device.

Another objective of the present invention is to provide a method of manufacturing an organic lighting device with a form factor equal to the form factor of the input substrate.

Another objective of the present invention is to provide a method of manufacturing an organic lighting device with a customizable size.

Another objective of the present invention is to provide a method of manufacturing an organic lighting device having an increased operational stability.

Another objective of the present invention is to provide a method of manufacturing an organic lighting device which has a high throughput.

Another objective of the present invention is to provide a method of manufacturing an organic lighting device that provides uniformity of the coated materials.

Embodiments of the present invention provide a method of manufacturing an organic lighting device that does not involve cutting or slicing the substrate. Also, the method allows manufacturing the organic lighting device with a customizable size.

The method includes high throughput first processing of one or more first product sized substrates. The first product sized substrates have a form factor substantially equal to a form factor of the organic lighting device. For example, the method includes manufacturing an organic lighting device having a form factor equal to or less than 900 square centimeters by a high throughput first processing of one or more first product sized substrates having a form factor substantially equal to 900 square centimeters. The high-throughput first processing employs one or more first small form factor manufacturing processes such as dip coating, spin coating, doctored blade, spray coating, screen printing, sputtering, inkjet printing and evaporation. The one or more first small form factor manufacturing processes being suitable for use on small form factor substrates. For example, spin coating when done on a large form factor substrate, tends to give variation in height of deposited layers from an inner periphery to an outer periphery; however, in small form factor substrate, this variation is minimal.

Thereafter, an active layer deposition processing is performed on the one or more first product sized substrates. Thereafter, a high throughput second processing of one or more second product sized substrates employing one or more second small form factor manufacturing processes is carried out. The second product sized substrates have a form factor substantially equal to the form factor of the organic lighting device. For example, the method includes manufacturing an organic lighting device having a form factor equal to or less than 900 square centimeters by a high throughput second processing of one or more second product sized substrates having a form factor substantially equal to 900 square centimeters. The one or more second small form factor manufacturing processes can be implemented by processes such as dip coating, spin coating, doctored blade, spray coating, screen printing, sputtering, inkjet printing and evaporation. The one or more second small form factor manufacturing processes being suitable for use on small form factor substrates. Thereafter, the first product sized substrates are encapsulated with the second product sized substrates to form the organic lighting device.

The one or more first product sized substrates and the one or more second product sized substrates have a first pre-defined form factor and a second pre-defined form factor, respectively, of less than or equal to 30 cm×30 cm. The form factor of the organic lighting device is equal to the first pre-defined form factor.

In an embodiment of the present invention, the first small form factor manufacturing processing of the first product sized substrates and the second small form factor manufacturing processing of the second product sized substrates are batch processes. Examples of the first small form factor manufacturing processes and the second small form factor manufacturing processes include, but are not limited to dip coating, spin coating, doctored blade, spray coating, screen printing, sputtering, glass mastering, glass cleaning, photoresist mastering, electroforming, and evaporation.

The form factor of the organic lighting device is equal to the form factor of the first product sized substrates and the second product sized substrates. In an embodiment of the present invention, a plurality of the organic lighting device of a small form factor is combined to form a large organic lighting device with a large form factor. The form factor of the large organic lighting device is customizable based on the requirement of a user. The large organic lighting device is formed without cutting or slicing the substrate.

In some embodiments, a method is provided for manufacturing an organic lighting device having a form factor substantially equal to or less than 900 square centimeters, without involving a cutting process. The method includes providing one or more first substrates having a surface area substantially equal to or less than the form factor. Thereafter, a high throughput first processing of the one or more first substrates is carried out using one or more first small form factor manufacturing processes. The one or more first small form factor manufacturing processes includes at least one of cleaning the one or more first substrates, depositing a hole-transport layer, depositing a light extraction layer and depositing a first layer of a conducting oxide.

Thereafter, the method includes active layer deposition processing of the one or more first substrates. The active layer deposition processing includes depositing an organic photoactive layer on the one or more substrates, such that each of the one or more organic material layers is deposited by using a batch process. Thereafter one or more second substrates having a surface area substantially equal to or less than the form factor are provided. Thereafter a high throughput second processing of the one or more second substrates is carried out using one or more second small form factor manufacturing processes. The one or more second small form factor manufacturing processes includes at least one of cleaning the one or more second substrates, depositing a second layer of a conducting oxide and depositing a gas absorbing chemical substance on the one or more second substrate. Finally, the method includes encapsulating at least one of the one or more first substrates with at least one of the one or more second substrates to form the organic lighting device of the form factor.

In an embodiment, the first small form factor manufacturing processes and the second small form factor manufacturing processes can be implemented by at least one of dip coating, spin coating, doctored blade, spray coating, screen printing, sputtering, glass mastering, glass cleaning, photoresist mastering, electroforming, and evaporation. Further, the one or more first small form factor manufacturing processes and the one or more second small form factor manufacturing processes for use on small form factor substrates. For example, spin coating when done on a large form factor substrate, tends to give variation in height of deposited layers from an inner periphery to an outer periphery; however, in small form factor substrate, this variation is minimal.

BRIEF DESCRIPTION OF THE DRAWINGS

Embodiments of the present invention will hereinafter be described in conjunction with the appended drawings provided to illustrate and not to limit the scope of the claims, wherein like designations denote like elements, and in which:

Those with ordinary skill in the art will appreciate that the elements in the figures are illustrated for simplicity and clarity and are not necessarily drawn to scale. For example, the dimensions of some of the elements in the figures may be exaggerated, relative to other elements, in order to improve the understanding of the present invention.

There may be additional structures described in the foregoing application that are not depicted on one of the described drawings. In the event such a structure is described, but not depicted in a drawing, the absence of such a drawing should not be considered as an omission of such design from the specification.

DETAILED DESCRIPTION

Various embodiments of the present invention provide a method of manufacturing an organic lighting device of form factor less than or equal to 30 cm×30 cm. The method includes performing one or more first small form factor manufacturing processes on one or more first product sized substrates, active layer deposition processing of the one or more first product sized substrates, performing one or more second small form factor manufacturing processes on one or more second product sized substrates and encapsulating the one or more first product sized substrates with the one or more second product sized substrates to form the organic lighting device.

Examples of the active layer deposition processes include at least one of thin film coating, evaporation, spin coating, screen printing processes and the like.

The first product sized substrates and the second product sized substrates have a pre-defined form factor of less than or equal to 30 cm×30 cm. The form factor of the organic lighting device is equal to the form factor of the first product sized substrates and the second product sized substrates.

An embodiment of the present invention provides a method for manufacturing an organic lighting device having a small form factor without involving a cutting process, for example, an organic lighting device having a form factor substantially equal to or less than 900 square centimeters can be manufactured using the method without using a cutting process. According to the method, various layers of the organic lighting device, for example, a substrate, electrodes, and organic material layers can be deposited using high throughput processes which are suitable for the small form factor. Further, since the method does not involve a cutting process, the efficiency of the method is increased. Additionally, the high throughput processes used in the method can be performed by a batch process. Also, each step involved in the method can be implemented in such a way that an idle time of a manufacturing facility used to implement the method is optimum.

Figure 1:
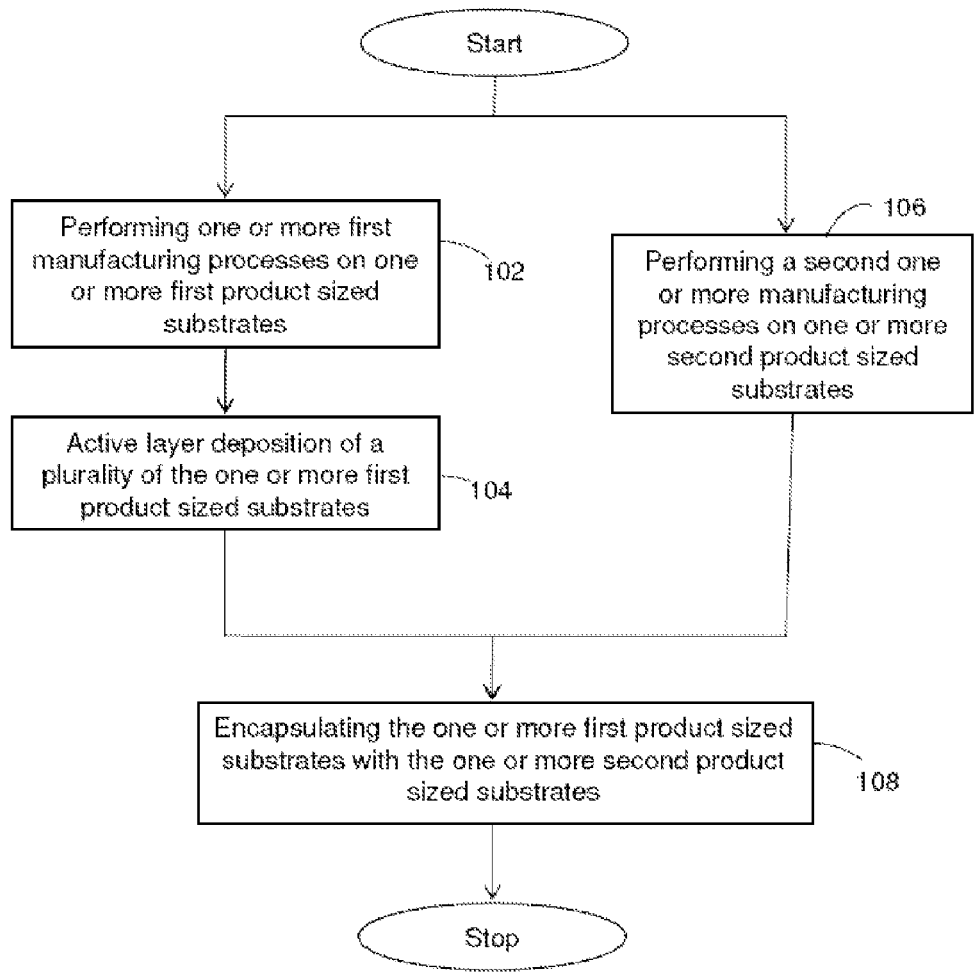
FIG. 1 is a flowchart depicting a method of manufacturing an organic lighting device, in accordance with an embodiment of the present invention.

FIG. 1 is a flowchart depicting a method of manufacturing an organic lighting device, in accordance with an embodiment of the present invention.

At step 102, high throughput first processes are performed on one or more first product sized substrates. The first product sized substrates act as a substrate which form a base of the organic lighting device. In an embodiment of the present invention, the first product sized substrates are composed of a transparent material. Examples of transparent material include, but are not limited to, glass, transparent plastic, fiberglass, and foil. In an embodiment of the present invention, the first product sized substrates have a pre-defined form factor of less than or equal to 30 cm×30 cm. The pre-defined form factor of the one or more first product sized substrates is substantially equal to a form factor of the organic lighting device being manufactured.

The high throughput first processing enables fast processing of the first product sized substrates in less time. Fast processing enables manufacturing of large quantity of the organic lighting device at a high rate. The high throughput first processes include one or more first small form factor manufacturing processes. In an embodiment of the present invention, the first small form factor manufacturing processes are conventionally optimized to manufacture sizes of less than or equal to 30 cm×30 cm. Examples of the first small form factor manufacturing processes, include, but are not limited to dip coating, spin coating, doctored blade, spray coating, screen printing, sputtering, glass mastering, photoresist mastering, electroforming, and evaporation. In an embodiment of the present invention, the first small form factor manufacturing processes is a batch process. Details corresponding to the first small form factor manufacturing processes have been provided in detail in conjunction with FIG. 2.

At step 104, active layer deposition processing is performed on the one or more first product sized substrates. The active layer deposition processing includes deposition of an active layer on the one or more first product sized substrates. In an embodiment of the present invention, active layer is an organic layer. Examples of active layer deposition processes include at least one of thin film coating, spin coating and screen printing, dip coating, doctored blade, spray coating, screen printing, sputtering, glass mastering, photoresist mastering, electroforming, and evaporation At step 106, high throughput second processing is performed on one or more second product sized substrates. The second product sized substrates are a substrate which forms the base of the organic lighting device. In an embodiment of the present invention, the second product sized substrates are composed of a transparent material or any of other suitable material such as aluminum foil sheet. Examples of transparent material include, but are not limited to, glass, transparent plastic, fiberglass, and foil. The second product sized substrates can be of any size having small form factor. In an embodiment of the present invention, the second product sized substrates have a second pre-defined form factor of less than or equal to 30 cm×30 cm. The pre-defined form factor of the one or more second product sized substrates is substantially equal to a form factor of the organic lighting device being manufactured.

The high throughput second processes enable fast processing of the second product sized substrates. Fast processing enables manufacturing of large quantity of the organic lighting device at a high rate. The high throughput second processes include one or more second small form factor manufacturing processes. In an embodiment of the present invention, examples of the second small form factor manufacturing processes include, but are not limited to dip coating, spin coating, doctored blade, spray coating, screen printing, sputtering, glass mastering, photoresist mastering, electroforming, and evaporation. In an embodiment of the present invention, the second small form factor manufacturing processes are batch processes. Details corresponding to the second small form factor manufacturing processes have been explained in detail in conjunction with FIG. 3.

In various embodiments of the present invention, the first small form factor manufacturing processes and the second small form factor manufacturing processes are same. Further, the first small form factor manufacturing processes and the second small form factor manufacturing processes do not involve the step of cutting, scribing or slicing of the first product sized substrates or the second product sized substrates.

At step 108, at least one of the first product sized substrates are encapsulated with the second product sized substrates to form the organic lighting device. In an embodiment of the present invention, encapsulation is done using a resin. The form factor of the organic lighting device is equal to the first predefined form factor and the second pre-defined form factor. Further, the method does not involve a cutting process to obtain the organic lighting device with the small form factor, i.e., a form factor of less than or equal to 30 cm×30 cm.

Example of resin includes, but is not limited to, an epoxy resin. Examples of the organic lighting device include, but are not limited to, Organic Light Emitting Diode (OLED), White Organic Light Emitting Diode (W-OLED), Active-matrix Organic Light Emitting Diodes (AMOLED), Passive-matrix Organic Light Emitting Diodes (PMOLED), Flexible Organic Light Emitting Diodes (FOLED), Stacked Organic Light Emitting Diodes (SOLED), Tandem Organic Light Emitting Diode, Transparent Organic Light Emitting Diodes (TOLED), Top Emitting Organic Light Emitting Diode, Bottom Emitting Organic Light Emitting Diode, Fluorescence doped Organic Light Emitting Diode (F-OLED), Phosphorescent Organic Light Emitting Diode (PHOLED).

In various embodiments of the present invention, the one or more first small form factor manufacturing processes and the one or more second small form factor manufacturing processes are performed simultaneously. In an embodiment of the present invention, the first small form factor manufacturing processes, the active layer deposition process, the second small form factor manufacturing processes and encapsulation process are conventionally optimized to meet required production rate with a minimum idle time.

Figure 2:
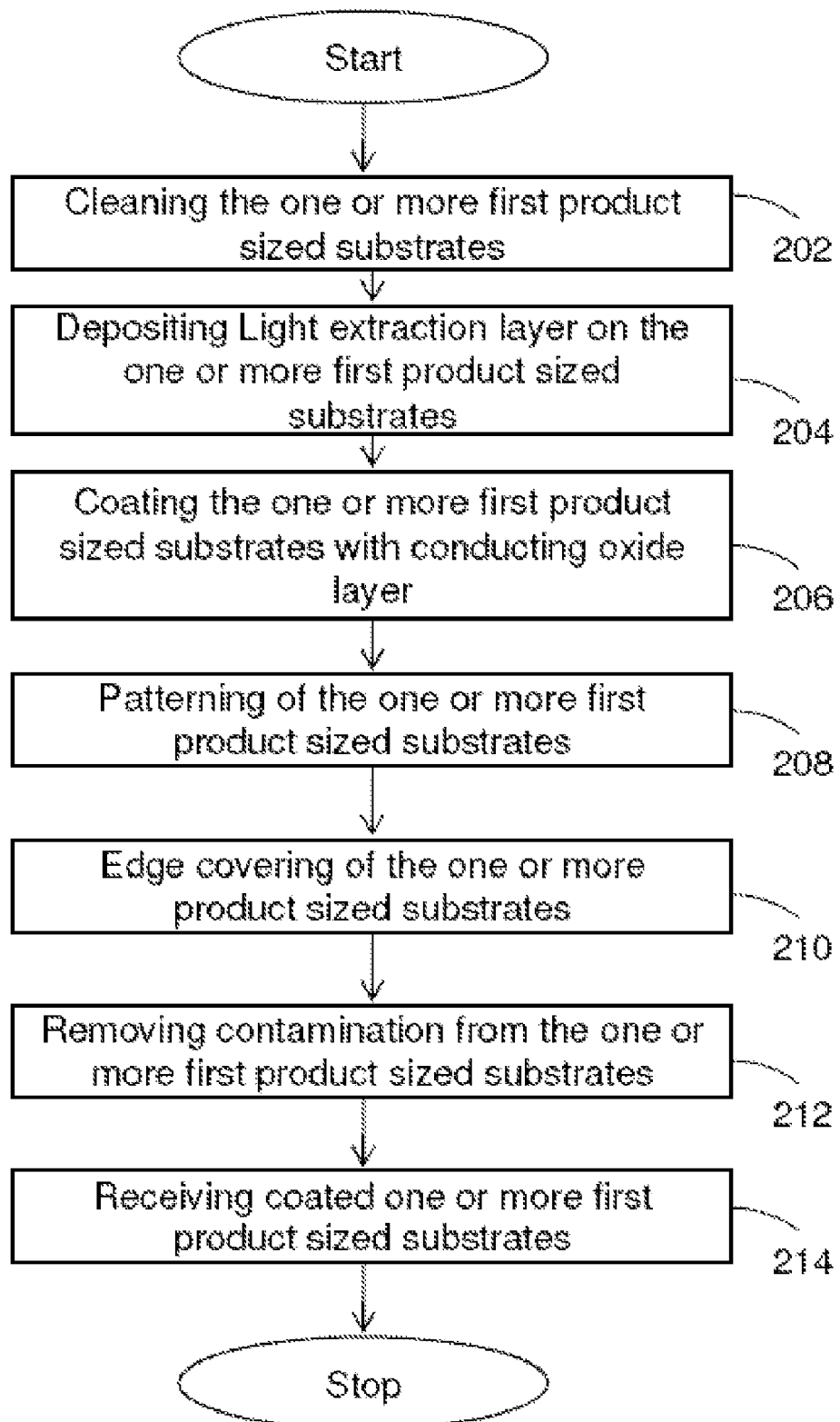
FIG. 2 is a flowchart depicting one or more first small form factor manufacturing processes for manufacturing an organic lighting device, in accordance with an embodiment of the present invention.

FIG. 2 is a flowchart depicting the one or more first small form factor manufacturing processes for manufacturing the organic lighting device, in accordance with an embodiment of the present invention.

At step 202, the first product sized substrates are cleaned to remove unwanted substances from the surface of the first product sized substrates. In an embodiment of the present invention, the cleaning of the first product sized substrates is performed through various methods. Examples of the methods include, but are not limited to, water rinsing, air cleaning, ultrasonication, megasonication, detergents, organic solvents and inorganic solvents. The cleaned first product sized substrates may be dried using various means such as air drying, hot air drying, and IR heater.

At step 204, a light extraction layer is deposited on the first product sized substrates. The light extraction layer scatters the light efficiently and enhances the performance of the organic lighting devices. In an embodiment of the present invention, the light extraction layer has various forms. Examples of forms include, but are not limited to, nanoparticle layer, gel layer, high refractive index layers such as that of SiNx, periodic array layers, and index matching layers.

A layer of a conducting oxide is coated on the first product sized substrate cells, at step 206. In an embodiment of the present invention, the conducting oxide layer is transparent in nature. Examples of the conducting oxide, include, but are not limited to Indium Tin Oxide, and Zinc Oxide. The conducting oxide is coated on the first product sized substrates using various methods, such as dip coating, spin coating, doctored blade, spray coating, screen printing, sputtering, glass mastering, photoresist mastering, electroforming, and evaporation.

At step 208, patterning is performed on the first product sized substrates. In an embodiment of the present invention, the first product sized substrates are patterned to adapt as per predefined design rules. In an embodiment of the present invention, various techniques such as lasers, mechanical devices, and chemical etching are used to pattern the first product sized substrates.

At step 210, an edge covering layer is coated on the first product sized substrates to cover the edges of conducting oxide layer. In an embodiment of the present invention, the edge covering layer is coated on the first product sized substrates using various methods such as dip coating, spin coating, doctored blade, spray coating, screen printing, sputtering, glass mastering, photoresist mastering, electroforming, and evaporation. In an embodiment of the present invention, step 208 is performed after step 210, i.e. patterning is performed on the first product sized substartes coated with the edge covering layer. In an embodiment of the present invention, various techniques such as lasers, mechanical devices, and chemical etching are used to pattern the first product sized substrates.

At step 212, contamination and/or impurities are removed from the first product sized substrates to form coated one or more first product sized substrates. In an embodiment of the present invention, the contamination and/or impurities are removed by subjecting the first product sized substrates to an ozone treatment generated by UV light. The ozone treatment removes the contamination and/or impurities such as oil, grease and dirt.

Coated one or more first product sized substrates are received at step 214.

Active layer deposition processing is performed on the coated one or more first product sized substrates to deposit organic layers on the coated first product sized substrates. In an embodiment of the present invention, organic layer includes a conducting layer and emissive layer. In an embodiment of the present invention, the organic layers on the coated first product sized substrates are deposited employing vacuum thermal evaporation. In another embodiment of the present invention, the organic layers on the coated first product sized substrates are deposited employing organic vapor phase deposition. The one or more first product sized substrates thus formed, have a form factor that is substantially equal to a form factor of the organic lighting device being manufactured.

Figure 3:
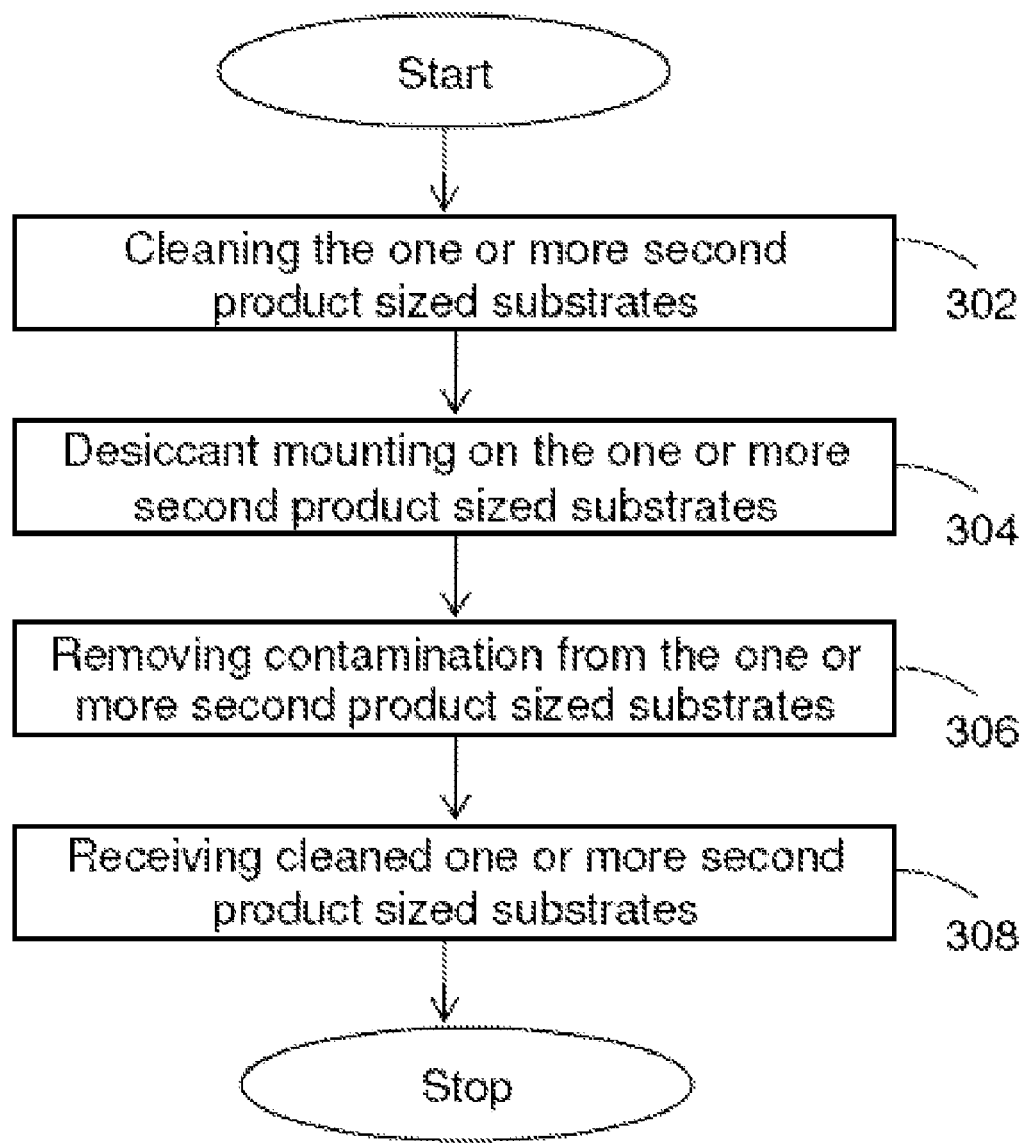
FIG. 3 is a flowchart depicting one or more second small form factor manufacturing processes for manufacturing an organic lighting device, in accordance with an embodiment of the present invention.

FIG. 3 is a flowchart depicting one or more second small form factor manufacturing processes for manufacturing the organic lighting device, in accordance with an embodiment of the present invention.

At step 302, the second product sized substrates are cleaned to remove unwanted substances from the surface of the second product sized substrates. In an embodiment of the present invention, the second product sized substrates are composed of a transparent material. Examples of transparent material include, but are not limited to, glass, transparent plastic, fiberglass, and foil. In an embodiment of the present invention, the cleaning of the one or more second product sized substrates is performed through various methods. Examples of various methods include, but are not limited to, water rinsing, air cleaning, ultrasonication, megasonication, detergents, organic solvents and inorganic solvents. The cleaned second product sized substrates may be dried using various means such as air drying, hot air drying, and IR heater.

At step 304, contamination and/or impurities are removed from the second product sized substrates. In an embodiment of the present invention, the contamination and/or impurities are removed by subjecting the second product sized substrates to an ozone treatment generated by UV light. The ozone treatment removes the contamination and/or impurities such as oil, grease and dirt.

At step 306, desiccant mounting is performed on the second product sized substrates. Desiccant mounting is a degassing mechanism which includes attaching a gas absorbing chemical substance on the surface of the second product sized substrates. In an embodiment of the present invention, the gas absorbing chemical substance is attached using various methods such as direct mounting, dip coating, spin coating, doctored blade, spray coating, screen printing, sputtering, inkjet printing and evaporation.

Step 302, 304 and 306 lead to formation of a cleaned one or more second product sized substrates at step 308. The cleaned one or more second product sized substrates are free of impurity or contamination.

Figure 4:
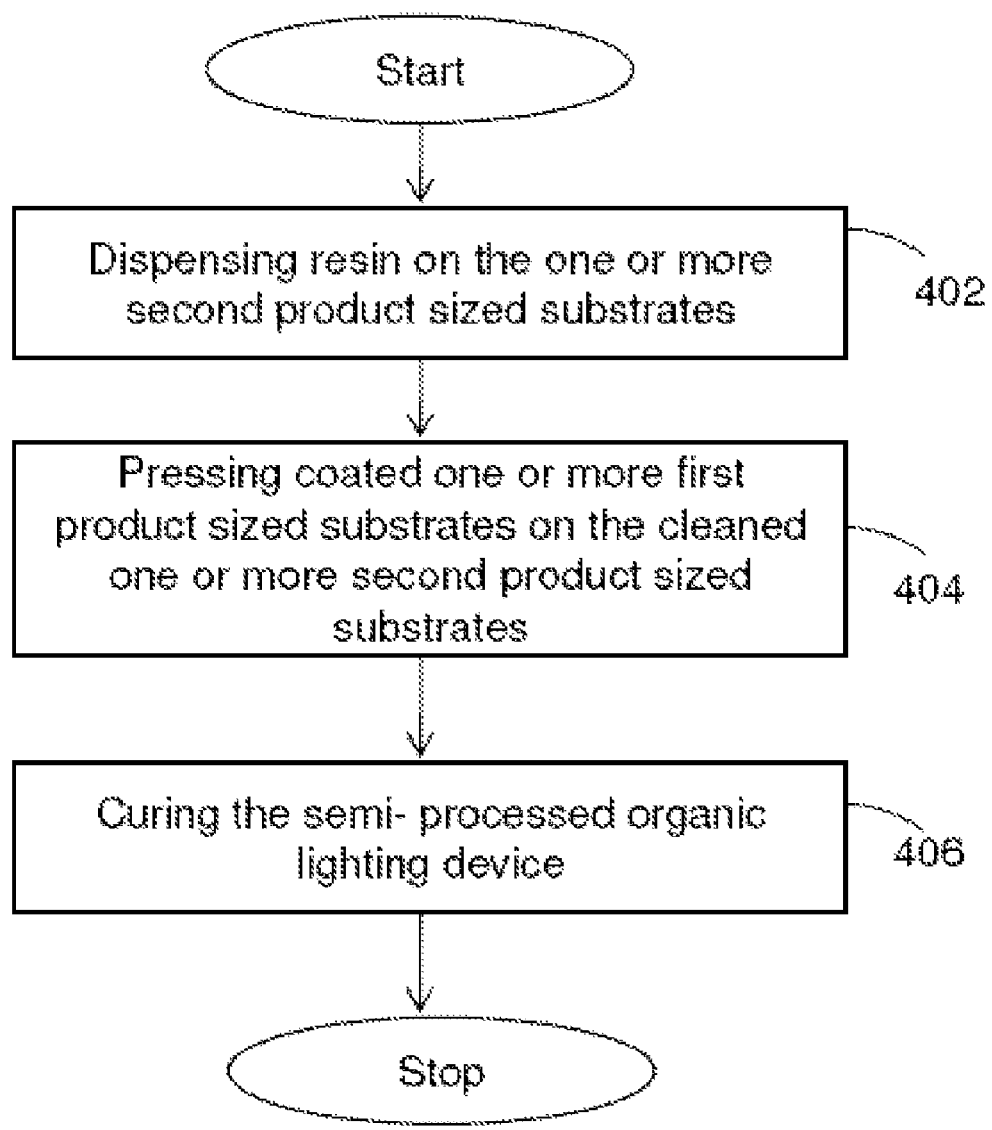
FIG. 4 is a flowchart depicting an encapsulating process for manufacturing an organic lighting device, in accordance with an embodiment of the present invention.

FIG. 4 is a flowchart depicting an encapsulating process for manufacturing an organic lighting device, in accordance with an embodiment of the present invention.

At step 402, resin is dispensed on the cleaned one or more second product sized substrates received at step 308. Dispensing is done by various methods including, but are not limited to, spin coating, screen printing, and XY movement coating. In an embodiment of the present invention, resin is an epoxy resin.

At step 404, the coated one or more first product sized substrates having organic layers and the second product sized substrates, from step 402, are pressed together to form a semi processed organic lighting device. In an embodiment of the present invention, pressing is done by mechanical means such as vacuum pressing.

At step 406, curing of the semi processed organic lighting device is performed by exposing to UV radiation. The UV radiation polymerizes the resin and encapsulates the first product sized substrates with the second product sized substrates to form the organic lighting device.

Figure 5:
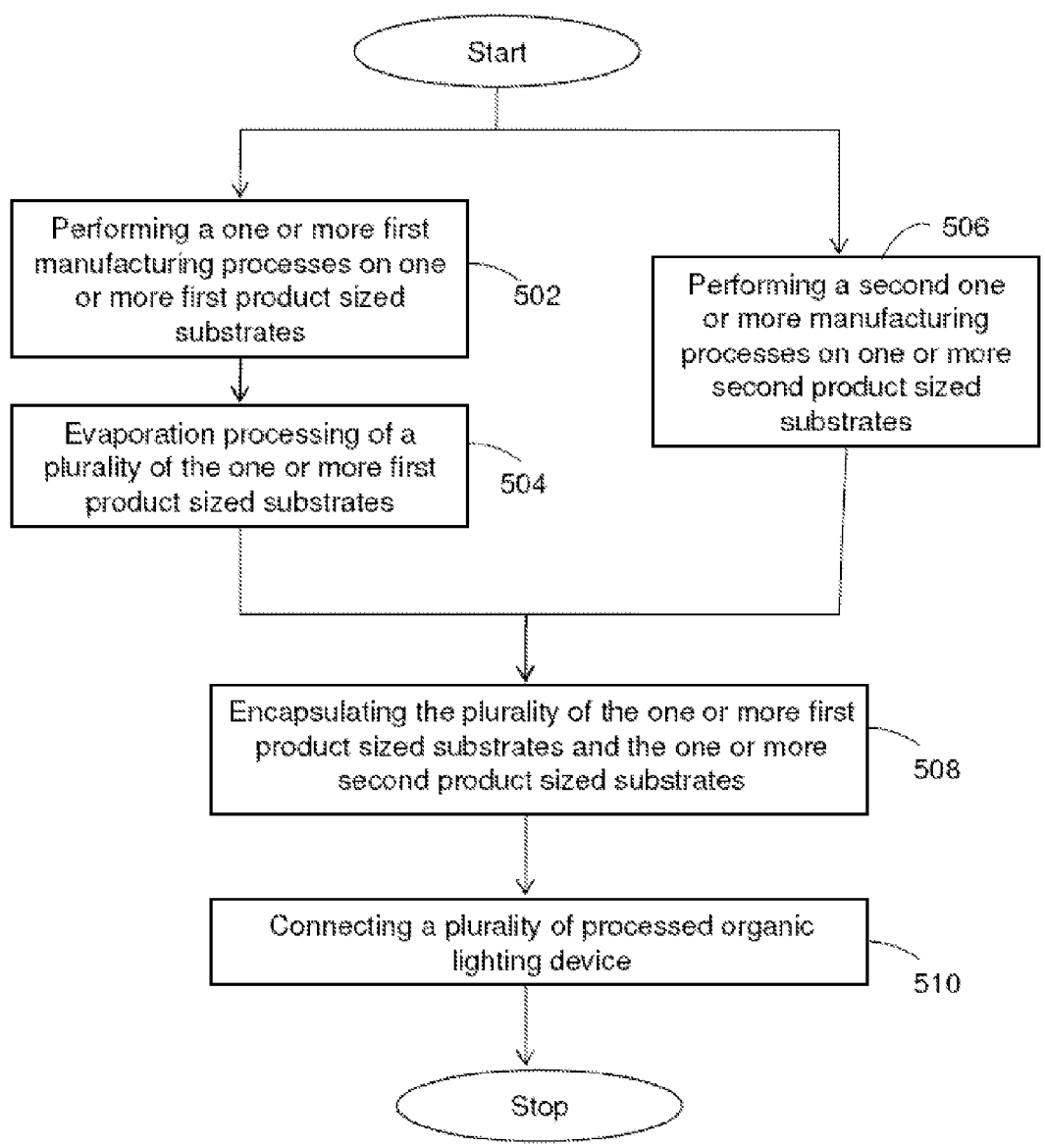
FIG. 5 is a flowchart depicting a method of manufacturing an organic lighting device, in accordance with another embodiment of the present invention.

FIG. 5 is a flowchart depicting a method of manufacturing the organic lighting device, in accordance with another embodiment of the present invention.

At step 502, high throughput first processes are performed on one or more first product sized substrates.

At step 504, active layer deposition processing is performed on the one or more first product sized substrates. In an embodiment of the present invention, the active layer deposition processing includes depositing an active layer on the one or more first product sized substrates. In an embodiment of the present invention, active layer is an organic layer.

At step 506, high throughput second processing is performed on one or more second product sized substrates. The first small form factor manufacturing processes and the first small form factor manufacturing processes are conventionally optimized to manufacture sizes of less than or equal to 30 cm×30 cm.

At step 508, at least one of the first product sized substrates are encapsulated with the second product sized substrates to form one or more organic lighting device. In an embodiment of the present invention, encapsulation is done using an epoxy resin. Further, the form factor of the organic lighting device is equal to the first pre-defined form factor or the second pre-defined form factor.

At step 510, a plurality of the one or more organic lighting device are connected in a predefined manner to form a large organic lighting device with a large form factor. In various embodiments of the present invention, the large form factor is a multiple of the first pre-defined form factor or the second predefined form factor. The large form factor is customizable based on the requirement. For example, large organic lighting device having large form factor of 180 cm×180 cm is formed by connecting 36 organic lighting devices of 30 cm×30 cm. In an embodiment of the present invention, the predefined manner is a series and/or parallel connection to optimize the optical output of the large organic lighting device. In various embodiments of the present invention, shape of the large organic lighting device is customizable. Examples of shape include a plane panel of required shape and size such as a rectangle, a hexagon, a square, a circle, a cube, a cuboid, a circular cylinder, a triangular cylinder, a pentagonal cylinder, a prism, a cone, a sphere and the like. The large organic lighting device acts as a surface light source. The light emitted from the surface light source appears to be emitted from a surface rather than a pointed light source.

Figure 6:
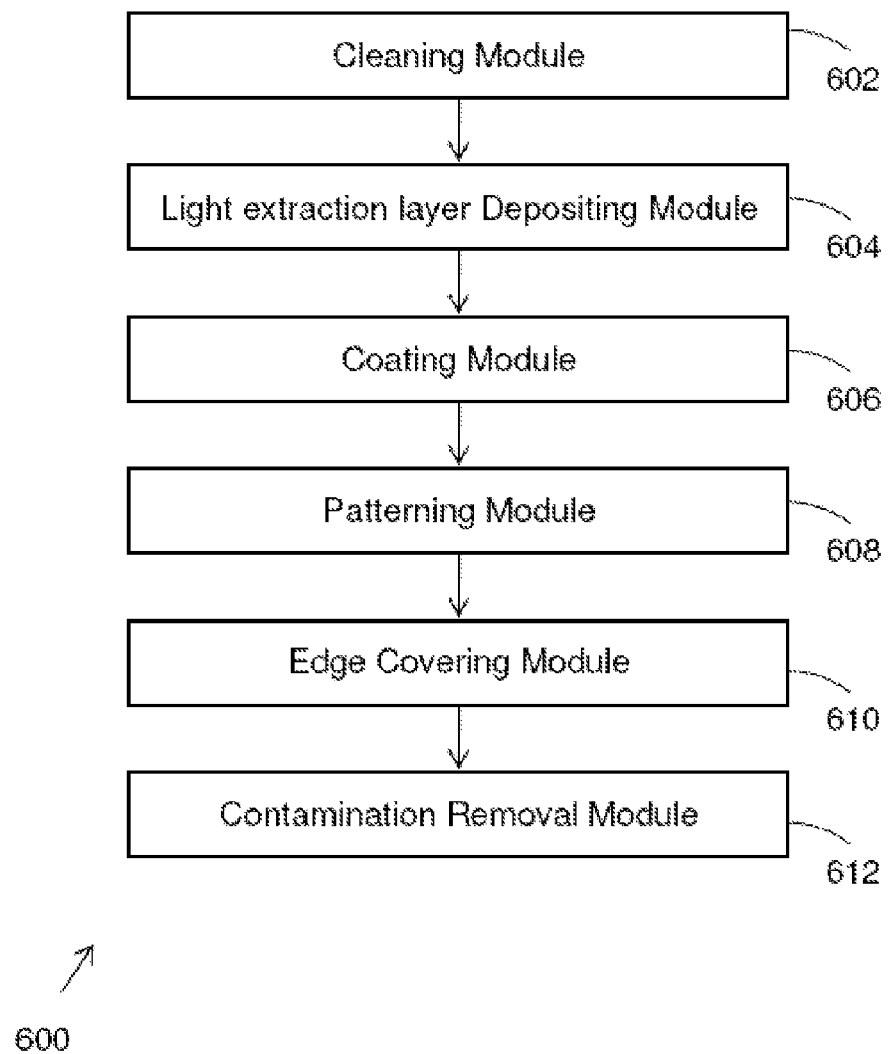
FIG. 6 is a system depicting one or more first small form factor manufacturing processes for manufacturing an organic lighting device, in accordance with an embodiment of the present invention.

FIG. 6 is a system depicting one or more first small form factor manufacturing processes for manufacturing an organic lighting device, in accordance with an embodiment of the present invention. System 600 includes a cleaning module 602, a light extraction layer depositing module 604, a coating module 606, a patterning module 608, an edge covering module 610 and a contamination removal module 612.

Cleaning module 602 cleans the first product sized substrates to remove unwanted substances from the surface of the first product sized substrates. In an embodiment of the present invention, the cleaning of the first product sized substrates is performed through various methods. Examples of the methods include, but are not limited to, water rinsing, air cleaning, ultrasonication, megasonication, detergents, organic solvents and inorganic solvents.

Light extraction layer depositing module 604 deposits a light extraction layer on the first product sized substrates. The light extraction layer scatters the light efficiently and enhances the performance of the organic lighting devices.

Coating module 606 coats a layer of a conducting oxide on the first product sized substrate cells. Examples of the conducting oxide, include, but are not limited to Indium Tin Oxide, and Zinc Oxide.

Patterning module 608 performs patterning on the first product sized substrates. In an embodiment of the present invention, various techniques such as lasers, mechanical devices, and chemical etching are used to pattern the first product sized substrates.

Edge covering module 610 coats an edge covering layer on the first product sized substrates to cover the edges of conducting oxide layer.

Contamination removal module 612 removes the contamination or impurities from the first product sized substrates to form coated one or more first product sized substrates.

In various embodiments of the present invention, cleaning module 602, light extraction layer depositing module 604, coating module 606, patterning module 608, edge covering module 610 and contamination removal module 612 are conventionally optimized to meet the required production rate with minimum idle time.

Figure 7:
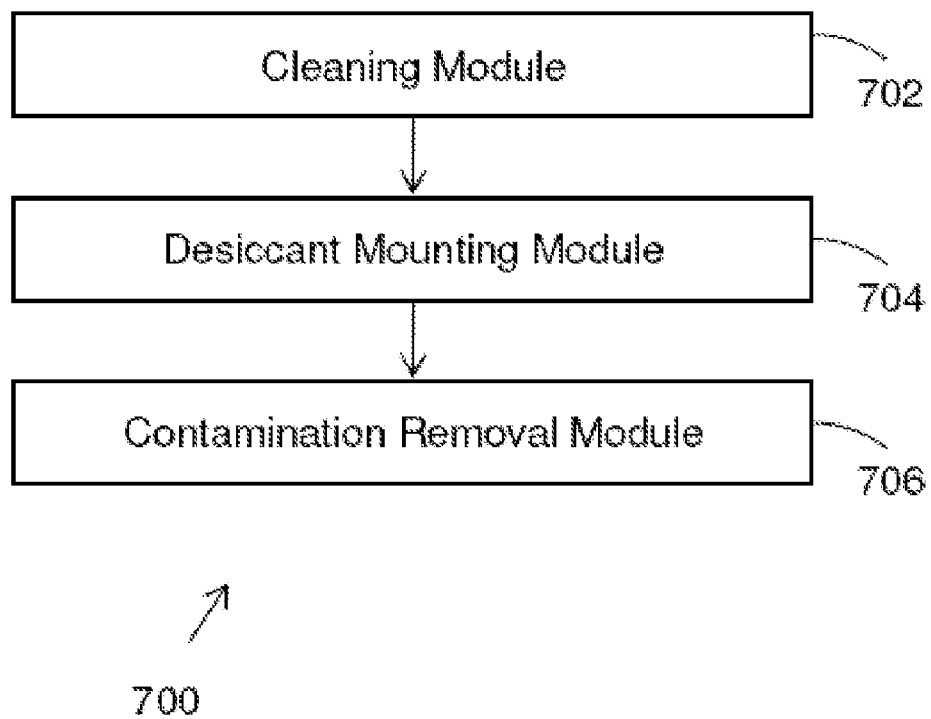
FIG. 7 is a system depicting one or more second small form factor manufacturing processes for manufacturing an organic lighting device, in accordance with an embodiment of the present invention.

FIG. 7 is a system depicting one or more second small form factor manufacturing processes for manufacturing an organic lighting device, in accordance with an embodiment of the present invention. System 700 includes a cleaning module 702, a desiccant mounting module 704 and a contamination removal module 706.

Cleaning module 702 cleans the second product sized substrates to remove unwanted substances from the surface of second product sized substrates. In an embodiment of the present invention, the second product sized substrates are composed of a transparent material. Examples of transparent material include, but are not limited to, glass, transparent plastic, fiberglass, and foil.

At step 704, Desiccant Mounting Module performs the desiccant mounting on the second product sized substrates by attaching a gas absorbing chemical substance on the surface of second sized substrates.

At step 706, Contamination Removal Module cleans the one or more second product sized substrates to remove impurity or contamination.

In various embodiments of the present invention, cleaning module 702, desiccant mounting module 704 and contamination removal module 706 are conventionally optimized to meet the required production rate with minimum idle time.

Figure 8:
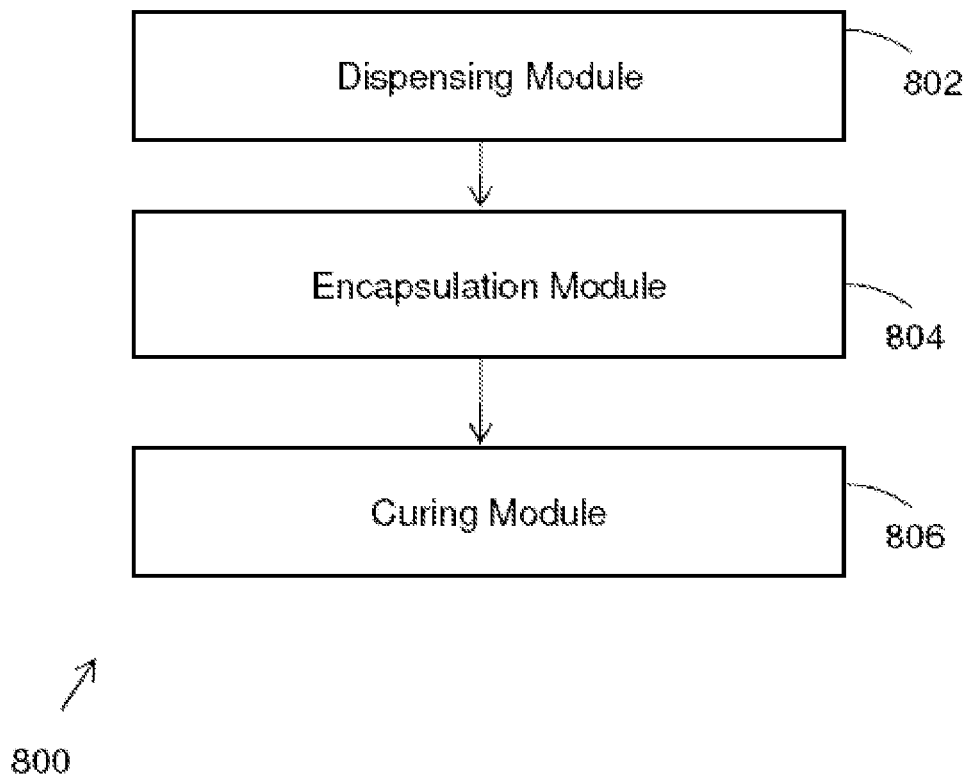
FIG. 8 is a flowchart depicting an encapsulating process for manufacturing an organic lighting device, in accordance with an embodiment of the present invention.

FIG. 8 is a system depicting an encapsulating process for manufacturing an organic lighting device, in accordance with an embodiment of the present invention. System 800 includes a dispensing module 802, an encapsulation module 804 and curing module 806.

Dispensing module 802 dispenses a resin on the cleaned one or more second product sized substrates. Dispensing is done by various methods including, but are not limited to, spin coating, screen printing, and XY movement coating. In an embodiment of the present invention, resin is an epoxy resin.

Encapsulation module 804 presses the coated one or more first product sized substrates having organic layers on the second product sized substrates to form a semi processed organic lighting device, In an embodiment of the present invention, encapsulation module 804 presses the second product sized substrate over the first product sized substrate.

Curing module 806 exposes the semi processed lighting device to Ultra Violet (UV) radiation. The UV radiation polymerizes the resin and encapsulates the first product sized substrates with the second product sized substrates to form the organic lighting device.

The form factor of the organic lighting device is equal to the form factor of the first product sized substrates and the second product sized substrates. The form factor of the organic lighting device is customizable based on the requirement of a user. Multiple organic lighting devices can be combined to form a large organic lighting device of a large form factor. The large organic lighting device is formed without cutting or slicing.

Embodiments of the present invention provide a method of manufacturing an organic lighting device of form factor less than or equal to 30 cm×30 cm. The method includes performing high throughput one or more first small form factor manufacturing processing of one or more first product sized substrates, active layer deposition processing of the one or more first product sized substrates, high throughput one or more second small form factor manufacturing processing of one or more second product sized substrates and encapsulating the first product sized substrates with the second product sized substrates. The one or more first product sized substrates and one or more first second film cells have a pre-defined form factor of less than or equal to 30 cm×30 cm, hence reducing the defects in the organic lighting device.

In addition, pre-defined form factor of less than or equal to 30 cm×30 cm achieves a uniformity of less than ±5% for different layers and reduces any homogeneities.

An embodiment of the present invention provides a method for manufacturing an organic lighting device having a small form factor without involving a cutting process, for example, an organic lighting device having a form factor substantially equal to or less than 900 square centimeters can be manufactured using the method without using a cutting process. According to the method, various layers of the organic lighting device, for example, a substrate, electrodes, and organic material layers can be deposited using high throughput processes which are suitable for the small form factor. Further, since the method does not involve a cutting process, the efficiency of the method is increased. Additionally, the high throughput processes used in the method can be performed by a batch process. Also, each step involved in the method can be implemented in such a way that an idle time of a manufacturing facility used to implement the method is optimum.

Figure 9:
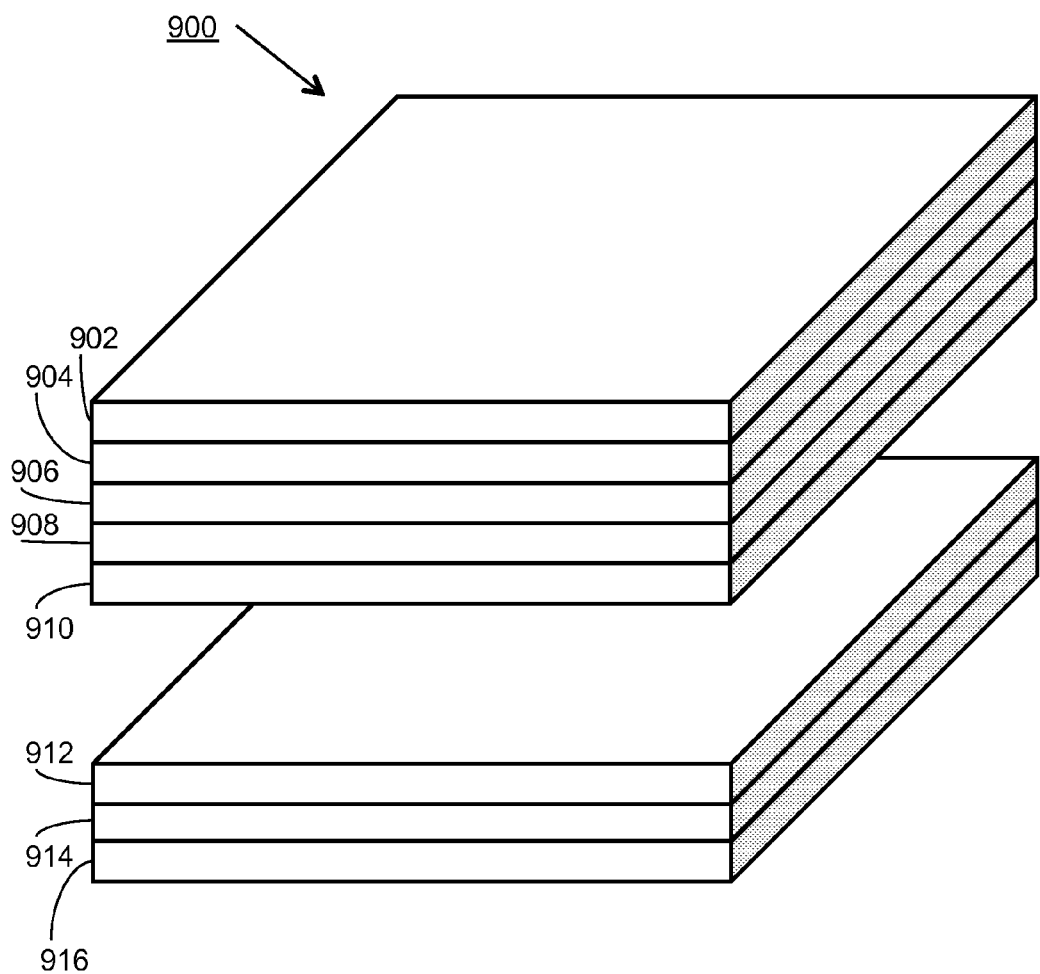
FIG. 9 is a diagrammatic illustration of an organic lighting device, in accordance with another embodiment of the present invention.

Referring now to FIG. 9, there is shown a diagrammatic illustration of an organic lighting device 900, in accordance with an embodiment of the present invention. The organic lighting device 900 can be one of an Organic Light Emitting Diode (OLED), a White Organic Light Emitting Diode (WOLED), an Active-matrix Organic Light Emitting Diodes (AMOLED), a Passive-matrix Organic Light Emitting Diodes (PMOLED), a Flexible Organic Light Emitting Diodes (FOLED), a Stacked Organic Light Emitting Diodes (SOLED), a Tandem Organic Light Emitting Diode, a Transparent Organic Light Emitting Diodes (TOLED), a Top Emitting Organic Light Emitting Diode, a Bottom Emitting Organic Light Emitting Diode, a Fluorescence doped Organic Light Emitting Diode (F-OLED), a Phosphorescent Organic Light Emitting Diode (PHOLED).

For the purpose of description, the organic lighting device 900 has been explained in reference to an OLED 900. However, it will be readily apparent to those ordinarily skilled in the art that the present invention can be implemented in any other organic lighting device. The OLED 900 is shown to include a first substrate 902, an internal light extraction layer 904, a first electrically conducting layer 906, one or more organic material layers 908 and 910, a second electrically conducting layer 912, a layer 914 of a gas absorbing chemical substance and a second substrate 916.

A surface area of the first substrate 902 is substantially equal to a pre-defined form factor, which is not greater than 900 square centimeters. Further, the surface area of the first substrate is substantially equal to the form factor of the organic lighting device. For example, the first substrate 902 can be a square substrate of dimensions not greater than 30 cm×30 cm. In accordance with this invention, the first substrate 902 can be of any shape as long as the surface area of the first substrate 902 is substantially equal to but not greater than 900 square centimeters. For example, in one embodiment the first substrate 902 can be circular in shape, however, in another embodiment, the shape of the first substrate 902 can be, but is not limited to, polygonal, annular or elliptical.

The first substrate 902 provides strength to the OLED 900, and also acts as an emissive surface of the OLED 900 when in use. The examples of the first substrate 902 include, but are not limited to, glass, flexible glass, polyethylene terephthalate (PET), polyethylene naphthalate (PEN), and other transparent or translucent material.

The first electrically conducting layer 906 and the second electrically conducting layer 912 are used to apply a voltage across the one or more organic material layers 908 and 910. The first electrically conducting layer 906 and the second electrically conducting layer 912, can be implemented with, for example, transparent conductive oxide (TCO), such as indium tin oxide (ITO), Fluorine doped Tin Oxide (FTO), Aluminum doped Zinc Oxide, a Carbon Nanotube Layer or other metals with appropriate work function to make injection of charge carriers such as calcium, aluminum, gold, or silver.

The one or more organic material layers 908 and 910 can be implemented with any organic electroluminescent material such as a light-emitting polymer, evaporated small molecule materials, light-emitting dendrimers or molecularly doped polymers. Examples of materials used for one or more organic material layers 908 and 910, include, but are not limited to, polyphenylene vinylene, copper phthalocyanine, carbon fullerenes and fullerene derivatives such as Phenyl-C61-butyric acid methyl ester, i.e., PCBM.

The first electrically conducting layer 906 can be deposited on the substrate 902. In an embodiment, the first electrically conducting layer 906 acts as an anode. The second electrically conducting layer 912 is deposited on the organic material layer 910. The second electrically conducting layer 912 can act as a cathode. In an embodiment, the organic material layer 908 is a conductive type semiconductor layer, such that, it is capable of facilitating transport of holes from the first electrically conducting layer 906, i.e., the anode. In an embodiment, the organic material layer 910 is an emissive type semiconductor layer, such that, it is capable of facilitating transport of electrons from the second electrically conducting layer 912, i.e., the cathode.

The light emitted by the one or more organic material layers 908 and 910 on reaching their interface with the first substrate 902, gets reflected back into the one or more organic material layers 908 and 910. This phenomenon is known as Total Internal Reflection (TIR) and presence of the internal light extraction layer 904 helps to reduce the reflection (or TIR) of the light back into the OLED 900. The internal light extraction layer 904 scatters the light efficiently and enhances the performance of the OLED 900. Examples of material that can be used in the internal light extraction layer 904 include, but are not limited to, nano-particle layer, gel layer, high refractive index layers such as that of SiNx, periodic array layers, and index matching layers.

The layer 914 of the gas absorbing chemical substance is provided on the second substrate 916 to absorb any gases that are released during the manufacturing of the OLED 900 and during use of the OLED 900. For example, the OLED 900 may undergo a curing process or exposure to heat. This may result in a release of contaminating gases from one or more layers in the OLED 900. The layer 914 of the gas absorbing chemical substance prevents contamination of the OLED 900 from the contaminating gases.

The second substrate 916 encapsulates the internal light extraction layer 904, the first electrically conducting layer 906, the one or more organic material layers 908 and 910, the second electrically conducting layer 912 and the layer 914 of the gas absorbing chemical substance between itself and the first substrate 902. A surface area of the second substrate 916 is substantially equal to the pre-defined form factor, which is not greater than 900 square centimeters. Further, the surface area of the second substrate is substantially equal to the form factor of the organic lighting device. For example, the second substrate 916 can be a square substrate of dimensions not greater than 30 cm×30 cm. In accordance with this invention, the second substrate 916 can be of any shape as long as the surface area of the second substrate 916 is substantially equal to but not greater than 900 square centimeters. For example, in one embodiment second substrate 916 can be circular in shape, however, in another embodiment, the shape of the second substrate 916 can be, but is not limited to, polygonal, annular or elliptical.

In an embodiment, the second substrate 916 is of the same shape and size as the first substrate 902. In another embodiment, the first electrically conducting layer 906, the one or more organic material layers 908 and 910, the second electrically conducting layer 912, the layer 914 of the gas absorbing chemical substance and the second substrate 916 can be of the same shape and size as the first substrate 902. In another embodiment, the first substrate 902, the first electrically conducting layer 906, the one or more organic material layers 908 and 910, the second electrically conducting layer 912, the layer 914 of the gas absorbing chemical substance and the second substrate 916 can be of the same shape and size as the OLED 900.

In an exemplary embodiment, a hole transfer layer (not shown in the Figures) may also be deposited on the first electrically conducting layer 906 before depositing the one or more organic material layers 908 and 910. The hole transfer layer is capable of enhancing a flow of holes from the first electrically conducting layer 906 to the organic material layer 908, and thereby increase an efficiency of the OLED 900.

Similarly, in yet another exemplary embodiment, an electron transfer layer (not shown in the Figures) may also be deposited on the organic material layer 910. The electron transfer layer is capable of enhancing a flow of electrons from the second electrically conducting layer 912 to the organic material layer 910, and thereby increase an efficiency of the OLED 900.

Figure 10:
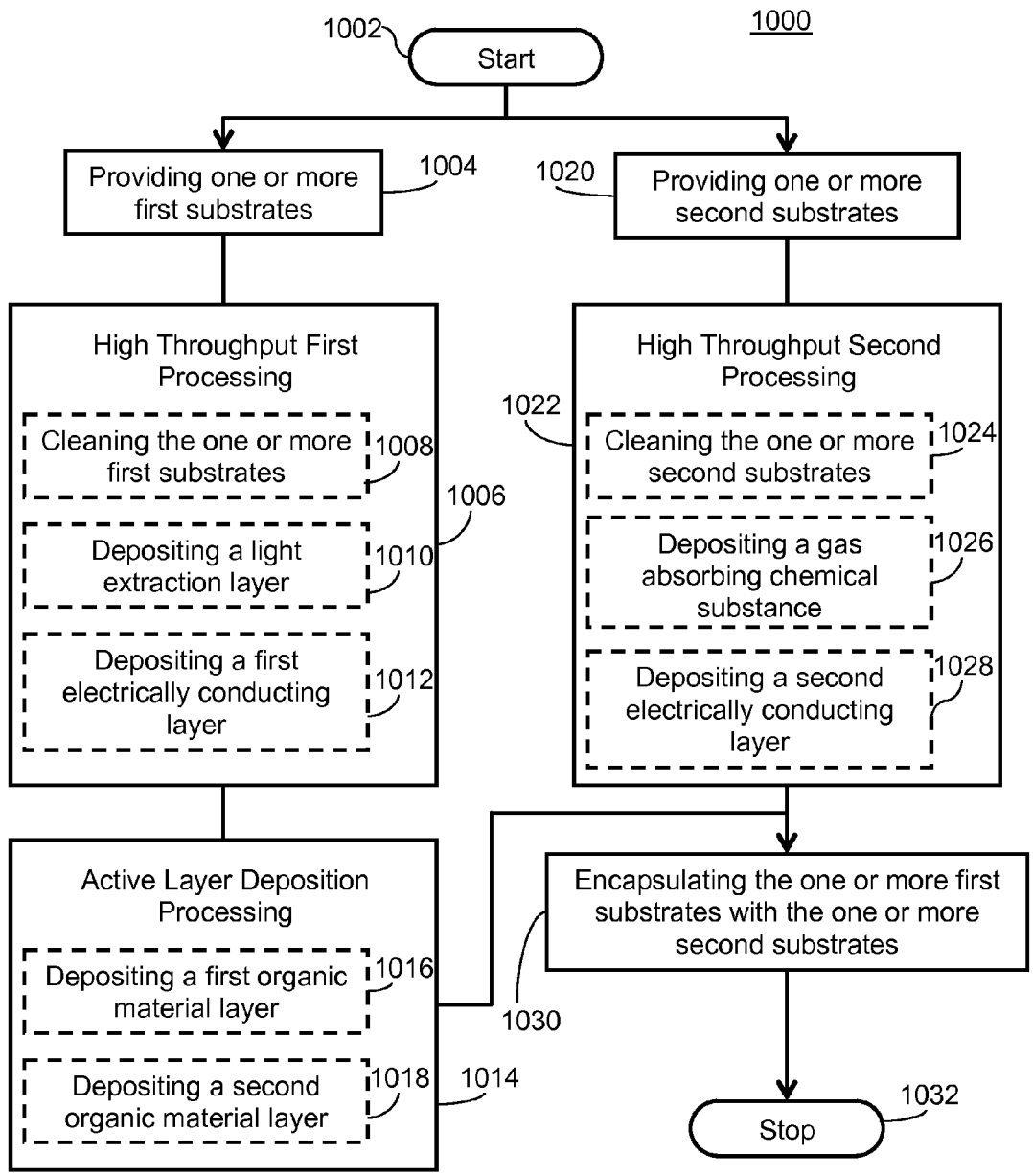
FIG. 10 is a flow chart describing a method of manufacturing an organic lighting device, in accordance with another embodiment of the present invention.

Moving on to FIG. 10, there is shown a flow chart describing a method 1000 of manufacturing an organic lighting device, in accordance with another embodiment of the present invention. In the subsequent description of the method 1000, reference will be made to FIG. 9 to elaborate on structural information pertaining to various embodiments of the organic lighting device and the method 1000.

For the purpose of this description, the method 1000 is explained for manufacturing of the OLED 900. However, it will be readily apparent to those ordinarily skilled in the art that the method 1000 can be used for manufacturing any other organic lighting device having more or less number of layers than the OLED 900. Moreover, the invention is not limited to the order in which the steps are listed in the method 1000. Further, it will also be apparent to those ordinarily skilled in the art that the method 1000 may include one or more additional steps for further enhancement of the effectiveness of the method 1000, however, are not essential to the method 1000, in accordance with the present invention.

The method 1000 is initiated at step 1002. At step 1004, one or more first substrates are provided. For the purpose of this description, the method 1000 will be explained in terms of a single substrate, for example, the first substrate 902. However, it will be readily apparent to that the method 1000 can be applicable to multiple substrates as well.

A size of the first substrate 902 is substantially equal to the pre-defined form factor, which is not greater than 900 square centimeters. For example, the first substrate 902 can be a square substrate of dimensions not greater than 30 cm×30 cm. The square substrate of dimensions substantially equal to and not greater than 30 cm×30 cm, is a standard-sized substrate, and significant number of manufacturing processes and equipments are standardized and optimized for a substrate of this size or surface area. For example, processes like, dip coating, spin coating, doctored blade processing, spray coating, screen printing, sputtering, electroforming and evaporation are already standardized for such a size and the corresponding manufacturing equipments are available as standard equipments.

In accordance with this invention, the first substrate 902 can be of any shape as long as the size of the first substrate 902 is substantially equal to but not greater than 900 square centimeters. For example, in one embodiment the first substrate 902 can be circular in shape, however, in another embodiment, the shape of the first substrate 902 can be, but is not limited to, polygonal, annular or elliptical.

Thereafter, at step 1006 the first substrate 902 undergoes a high throughput first processing. The high throughput first processing enables fast processing of the first substrate 902 in less time. Fast processing enables manufacturing of large quantity of the organic lighting device at a high rate. The high throughput first processing include one or more first small form factor manufacturing processes. Examples of the first small form factor manufacturing processes, include, but are not limited to dip coating, spin coating, doctored blade, spray coating, screen printing, sputtering, glass mastering, photoresist mastering, electroforming, and evaporation. In an embodiment of the present invention, the first small form factor manufacturing processes is a batch process.

In an embodiment, the step 1006 may include one or more of sub steps 1008, 1010 and 1012. However, the invention is not limited to the order in which the sub steps 1008, 1010 and 1012 are listed in the method 1000. Moreover, it will also be apparent to those ordinarily skilled in the art that the step 1006 may include one or more additional sub steps for further enhancement of the effectiveness of the method 1000. As mentioned above, the sub steps 1008, 1010 and 1012 are optional. It will be readily apparent to those ordinarily skilled in the art that an organic lighting device can be manufactured by omitting any one of the sub steps 1008, 1010 and 1012 from the method 1000 without deviating from the scope of the present invention.

At the sub step 1008, the first substrate 902 is cleaned prior to performing subsequent steps of the method 1000. For example, the first substrate 902 may be cleaned using an Ultrasonic or a Megasonic cleaning technique. Other examples of the cleaning methods include, but are not limited to, water rinsing, air cleaning, detergents, organic solvents and inorganic solvents.

At the sub step 1010, a light extraction layer is deposited on the first substrate 902. For example, the light extraction layer can be the internal light extraction layer 904. In an embodiment, an additional light extraction layer can also be deposited. The additional light extraction layer may be an external light extraction layer. In an embodiment, the light extraction layer may be patterned. In an embodiment, various techniques such as lasers, mechanical devices, and chemical etching can be used to pattern the light extraction layer.

At the sub step 1012, a first electrically conducting layer, for example, the first electrically conducting layer 906 can be applied on the light extraction layer. In an embodiment of the present invention, the first electrically conducting layer 906 is transparent in nature. The first electrically conducting layer 906 can be applied using various methods, such as dip coating, spin coating, doctored blade, spray coating, screen printing, sputtering, glass mastering, photoresist mastering, electroforming, and evaporation.

The step 1006 may also include a sub step (not shown in the Figure) in which an edge covering layer is coated on the first substrate to cover the edges of the first electrically conducting layer 906. In an embodiment, the edge covering layer is coated on the first substrate 902 using various methods such as dip coating, spin coating, doctored blade, spray coating, screen printing, sputtering, glass mastering, photoresist mastering, electroforming, and evaporation.

The step 1006 may also include another sub step (not shown in the Figure) in which contamination and/or impurities are removed from the first substrate 902 to form a substrate that is ready for subsequent steps of the method 1000. In an embodiment of the present invention, the contamination and/or impurities are removed by subjecting the first substrate 902 to an ozone treatment generated by UV light. The ozone treatment removes the contamination and/or impurities such as oil, grease and dirt.

Thereafter at step 1014, active layer deposition processing of the one or more first substrates is carried out. The step 1014 of active layer deposition processing includes deposition of an active layer on the first substrate 902. In an embodiment, the active layer can be an organic layer. Examples of active layer deposition processing include at least one of thin film coating, spin coating and screen printing, dip coating, doctored blade, spray coating, screen printing, sputtering, glass mastering, photoresist mastering, electroforming, and evaporation.

In an embodiment, the step 1014 may include one or more of sub steps 1016 and 1018. However, the invention is not limited to the order in which the sub steps 1016 and 1018 are listed in the method 1000. Moreover, it will also be apparent to those ordinarily skilled in the art that the step 1014 may include one or more additional sub steps for further enhancement of the effectiveness of the method 1000. As mentioned above, the sub step 1016 and the sub step 1018 are optional. It will be readily apparent to those ordinarily skilled in the art that an organic lighting device can be manufactured by omitting any one of the sub step 1016 and the sub step 1018 from the method 1000 without deviating from the scope of the present invention.

The sub step 1016 includes depositing a first organic material layer, for example, the organic material layer 908. Similarly, the sub step 1018 includes depositing a second organic material layer, for example the organic material layer 910. In an embodiment, each of the sub steps 1016 and 1018 of the active layer deposition processing is a batch process.

In a batch process for depositing the first organic material layer 908, for example, an input set of multiple first substrates is provided. The first organic material layer 908 is deposited on each first substrate 902 of the multiple first substrates. An output of the batch process is a set of multiple deposited first substrates, i.e., a set of the multiple first substrates deposited with the first organic material layer 908. Thereafter, the multiple deposited first substrates are carried forward for further processing as per subsequent steps of the method 1000.

Examples of processes that can be implemented as the batch process for the step 1014 include, but are not limited to, dip coating, spin coating, doctored blade processing, spray coating, screen printing, sputtering, electroforming and evaporation.

It will be readily apparent to those ordinarily skilled in the art that the batch process may be included in the method 1000 without deviating from the scope of the invention. It will also be readily apparent to those ordinarily skilled in the art that the method 1000 may be optimized for high-throughput by using the batch process.

The high throughput processes are performed using a manufacturing process which is suitable for the pre-defined small form factor of substrates. Examples of the manufacturing process include, but are not limited to, dip coating, spin coating, doctored blade processing, spray coating, screen printing, sputtering, electroforming and evaporation.

The steps 1004, 1006 and 1014 lead to the formation of a cleaned one or more first substrates. The cleaned one or more first substrates are free of impurity or contamination and ready for use in subsequent steps of the method 1000.

Thereafter, at step 1020, one or more second substrates are provided. For the purpose of this description, the method 1000 will be explained in terms of a single substrate, for example, the second substrate 916. However, it will be readily apparent to that the method 1000 can be applicable to multiple substrates as well.

A size of the second substrate 916 is substantially equal to the pre-defined form factor, which is not greater than 900 square centimeters. For example, the second substrate 916 can be a square substrate of dimensions not greater than 30 cm×30 cm. The square substrate of dimensions substantially equal to and not greater than 30 cm×30 cm, is a standard-sized substrate, and significant number of manufacturing processes and equipments are standardized and optimized for a substrate of this size or surface area. For example, processes like, dip coating, spin coating, doctored blade processing, spray coating, screen printing, sputtering, electroforming and evaporation are already standardized for such a size and the corresponding manufacturing equipments are available as standard equipments.

In accordance with this invention, second substrate 916 can be of any shape as long as the size of second substrate 916 is substantially equal to but not greater than 900 square centimeters. For example, in one embodiment the second substrate 916 can be circular in shape, however, in another embodiment, the shape of the second substrate 916 can be, but is not limited to, polygonal, annular or elliptical.

Thereafter, at step 1022 second substrate 916 undergoes a high throughput second processing. The high throughput second processing enables fast processing of the second substrate 916 in less time. Fast processing enables manufacturing of large quantity of the organic lighting device at a high rate. The high throughput second processes include one or more second small form factor manufacturing processes. Examples of the second small form factor manufacturing processes, include, but are not limited to dip coating, spin coating, doctored blade, spray coating, screen printing, sputtering, glass mastering, photoresist mastering, electroforming, and evaporation. In an embodiment of the present invention, the second small form factor manufacturing processes is a batch process.

In an embodiment, the step 1022 may include one or more of sub steps 1024, 1026 and 1028. However, the invention is not limited to the order in which the sub steps 1024, 1026 and 1028 are listed in the method 1000. Moreover, it will also be apparent to those ordinarily skilled in the art that the step 1022 may include one or more additional sub steps for further enhancement of the effectiveness of the method 1000. As mentioned above, the sub steps 1024, 1026 and 1028 are optional. It will be readily apparent to those ordinarily skilled in the art that an organic lighting device can be manufactured by omitting any one of the sub steps 1024, 1026 and 1028 from the method 1000 without deviating from the scope of the present invention.

At the sub step 1024, the second substrate 916 is cleaned prior to performing subsequent steps of the method 1000. For example, the second substrate 916 may be cleaned using an Ultrasonic or a Megasonic cleaning technique. Other examples of the cleaning methods include, but are not limited to, water rinsing, air cleaning, detergents, organic solvents and inorganic solvents.

At the sub step 1026, desiccant mounting is performed on the second substrate 916. Desiccant mounting is a degassing mechanism which includes attaching a gas absorbing chemical substance on the surface of the second substrate 916 to form, for example, the layer 914 of the gas absorbing chemical substance. In an embodiment of the present invention, the gas absorbing chemical substance is attached using various methods such as direct mounting, dip coating, spin coating, doctored blade, spray coating, screen printing, sputtering, inkjet printing and evaporation.

At the sub step 1028, a second electrically conducting layer, for example, the second electrically conducting layer 912 can be applied on the second substrate 916. The second electrically conducting layer 912 can be applied using various methods, such as dip coating, spin coating, doctored blade, spray coating, screen printing, sputtering, glass mastering, photoresist mastering, electroforming, and evaporation.

In an embodiment, the step 1022 may include a sub step (not shown in the Figure) in which contamination and/or impurities are removed from the second substrate 916. In an embodiment of the present invention, the contamination and/or impurities are removed by subjecting the second substrate 916 to an ozone treatment generated by UV light. The ozone treatment removes the contamination and/or impurities such as oil, grease and dirt.

The steps 1020 and 1022 lead to the formation of a cleaned one or more second substrates. The cleaned one or more second substrates are free of impurity or contamination and ready for use in subsequent steps of the method 1000.

Thereafter, at step 1030, at least one of the one or more of the first substrates, for example, the first substrate 902, and at least one of the one or more of the second substrates, for example, the second substrate 916, are encapsulated. In an embodiment, at the step 1030, resin is dispensed on the cleaned one or more second substrates. Dispensing is done by various methods including, but are not limited to, spin coating, screen printing, and XY movement coating. In an embodiment of the present invention, resin is an epoxy resin. Thereafter, the cleaned one or more first substrates and the cleaned one or more second substrates, are pressed together to form a semi processed organic lighting device. In an embodiment of the present invention, pressing is done by mechanical means such as vacuum pressing. Thereafter, curing of the semi processed organic lighting device is performed by exposing to UV radiation. The UV radiation polymerizes the resin and encapsulates the one or more first substrates with the one or more second substrates to form the organic lighting device. Although, here reference is made to ultra-violet curing, it will be readily apparent to those ordinarily skilled in the art that other forms of curing may also be performed without deviating from the scope of the invention.

Thereafter, the method 1000 is terminated at step 1032.

As per the foregoing description of steps involved in the method 1000, the method 1000 does not involve a cutting process. Absence of the cutting process makes the method 1000 efficient. Additionally, since the cutting process is not involved, a size of the organic lighting device 900 is substantially similar to a size of the first substrate 902 and/or the second substrate 916, i.e., an input substrate is similar in size to an output device. Further, the first substrate 902, the first electrically conducting layer 906, the one or more organic material layers 908 and 910, the second electrically conducting layer 912, the layer 914 of the gas absorbing chemical substance and the second substrate 916 deposited according to the method 1000 are of substantially the same shape and size as the OLED 900.

Each of the steps involved in the method 1000 may be performed by a batch process. Further, each of the steps involved in the method 1000 may be implemented in such a way that an idle time of the manufacturing facility used to implement the method 1000 is optimum. In an exemplary scenario, a time corresponding to each of the method steps in method 1000 is designed to be substantially same, thereby reducing a waiting time between each process and optimizing the idle time for the manufacturing facility.

Most of the high throughput manufacturing process mentioned above have been optimized and standardized for the pre-defined form factor, i.e., for a surface area of substantially equal to but not greater than 900 square centimeters. However, there are limitations on using these processes for larger substrates, i.e., for substrates larger than the pre-defined size. They tend to generate outputs of sub-optimal quality or efficiency. For example, the uniformity of thickness of layers deposited by using spin coating may not be maintained over the large substrates. It may also induce defects, like, pinholes and non-homogeneity of the layers when used on large substrates.

Generally, a high throughput manufacturing process is a process that is suitable for mass production, and therefore, produces a large quantity of products in a given time. In context of the method 1000, when a method step is mentioned to have a high throughput, it refers that the method step is suitable to be performed for producing a bulk quantity of organic lighting devices. Generally, the high throughput process can be defined as a process capable of processing nearly 2.5 million products per year. In other words, the high throughput process is a process that requires nearly 10 seconds for processing each product. For example, each method step that is mentioned to have a high throughput is substantially performed in nearly 10 seconds.

It will also be appreciated by a person skilled in the art that a production capacity of 2.5 million products per year and an idle time of 10 seconds are provided only as an example for illustrating the high throughput process, and do not depict any limitation of the invention. The production capacity and the idle time of the high throughput process, in accordance with the present invention, may be higher or lower than the ranges mentioned above.

In real life applications, one or more organic lighting devices manufactured as per the method 1000 may be connected by using series or parallel connections to obtain an arrangement that can produce optical output as per a requirement. Additionally, the one or more organic lighting devices may be connected by using series or parallel connections to obtain an optimum optical output. Also, it will be readily apparent to those ordinarily skilled in the art that the one or more organic lighting devices may also be connected with organic lighting devices prepared from other methods in real life applications.

In the description herein for the embodiments of the present invention, numerous specific details are provided, such as examples of components and/or methods, to provide a thorough understanding of the embodiments of the present invention. One skilled in the relevant art will recognize, however, that an embodiment of the present invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of the embodiments of the present invention.

Reference throughout this specification to "one embodiment", "an embodiment", or "a specific embodiment" means that a particular feature, structure, or characteristic described in connection with the embodiment is included in at least one embodiment of an embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

It will also be appreciated that one or more of the elements depicted in the drawings/figures can also be implemented in a more separated or integrated manner, or even removed or rendered as inoperable in certain cases, as is useful in accordance with a particular application.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the present invention to the precise forms disclosed herein. While specific embodiments of, and examples for, the present invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of the embodiments of the present invention will be employed without a corresponding use of other features without departing from the scope and spirit of the present invention as set forth. Therefore, many modifications may be made to adapt a particular situation or material to the essential scope and spirit of the present invention. It is intended that the present invention not be limited to the particular terms used in following claims and/or to the particular embodiment disclosed as the best mode contemplated for carrying out this present invention, but that the present invention will include any and all embodiments and equivalents falling within the scope of the appended claims.

What is claimed is:

1. A method of manufacturing an organic light emitting device, said organic lighting device having a form factor substantially equal to or less than 900 square centimeters, said method comprising:

providing one or more first substrates, wherein a surface area of said one or more first substrates is substantially equal to said form factor;

a high throughput first processing of said one or more first substrates using one or more first small form factor manufacturing processes, wherein said high throughput first processing comprises at least one of cleaning said one or more first substrates, depositing a light extraction layer and depositing a first electrically conducting layer, further wherein said one or more first small form factor manufacturing processes comprise at least one of dip coating, spin coating, doctored blade, spray coating, screen printing, sputtering, glass mastering, photoresist mastering, electroforming, and evaporation;

an active layer deposition processing of said one or more first substrates, wherein said active layer deposition processing comprises depositing one or more organic material layers on said one or more first substrates, wherein each of said one or more organic material layers is deposited by using a batch process;

providing one or more second substrates, wherein a surface area of said one or more second substrates is substantially equal to said form factor;

a high throughput second processing of said one or more second substrates using one or more second small form factor manufacturing processes, wherein said high throughput second processing comprises at least one of cleaning said one or more second substrates, depositing a second electrically conducting layer and depositing a gas absorbing chemical substance on said one or more second substrate, further wherein said one or more second form factor manufacturing processes comprise at least one of dip coating, spin coating, doctored blade, spray coating, screen printing, sputtering, glass mastering, photoresist mastering, electroforming, and evaporation; and encapsulating at least one of said one or more first substrates with at least one of said one or more second substrates to form said organic lighting device of said form factor, wherein said method of manufacturing said organic lighting device does not involve a cutting process.

2. The method according to claim 1, wherein said method is conventionally optimized to meet an optimized production rate with an optimized idle time between processes.

3. The method according to claim 1 further comprising, connecting one or more said organic lighting device in at least one of parallel and series connections, whereby forming a large organic lighting device having a large form factor, wherein optical output of said large organic lighting device is optimized.

4. The method according to claim 1, wherein said organic lighting device is one of a White Organic Light Emitting Diode (WOLED), an Active-matrix Organic Light Emitting Diodes (AMOLED), a Passive-matrix Organic Light Emitting Diodes (PMOLED), a Flexible Organic Light Emitting Diodes (FOLED), a Stacked Organic Light Emitting Diodes (SOLED), a Tandem Organic Light Emitting Diode , a Transparent Organic Light Emitting Diodes (TOLED), a Top Emitting Organic Light Emitting Diode, a Bottom Emitting Organic Light Emitting Diode, a Fluorescence doped Organic Light Emitting Diode (F-OLED), a Phosphorescent Organic Light Emitting Diode (PHOLED).

5. The method according to claim 1, wherein said one or more first small form factor manufacturing processes are and said one or more second small form manufacturing processes are a batch process.

6. A method of manufacturing an organic light emitting device, said organic lighting device having a form factor substantially equal to or less than 900 square centimeters, said method comprising:
providing one or more first substrates, wherein a surface area of said one or more first substrates is substantially equal to said form factor;
a high throughput first processing of said one or more first substrates using one or more first small form factor manufacturing processes, wherein said high throughput first processing comprises at least one of cleaning said one or more first substrates, depositing a light extraction layer and depositing a first electrically conducting layer;
an active layer deposition processing of said one or more first substrates, wherein said active layer deposition processing comprises depositing one or more organic material layers on said one or more first substrates, wherein each of said one or more organic material layers is deposited by using a batch process;
providing one or more second substrates, wherein a surface area of said one or more second substrates is substantially equal to said form factor;
a high throughput second processing of said one or more second substrates using one or more second small form factor manufacturing processes, wherein said high throughput second processing comprises at least one of cleaning said one or more second substrates, depositing a second electrically conducting layer and depositing a gas absorbing chemical substance on said one or more second substrate; and
encapsulating at least one of said one or more first substrates with at least one of said one or more second substrates to form said organic lighting device of said form factor, wherein said method of manufacturing said organic lighting device does not involve a cutting process.

7. The method according to claim 6, wherein said method is conventionally optimized to meet an optimized production rate with an optimized idle time between processes.

8. The method according to claim 6 further comprising, connecting one or more said organic lighting device in at least one of parallel and series connections, whereby forming a large organic lighting device having a large form factor, wherein optical output of said large organic lighting device is optimized.

9. The method according to claim 6, wherein said one or more first small form factor manufacturing processes comprises at least one of dip coating, spin coating, doctored blade, spray coating, screen printing, sputtering, glass mastering, photoresist mastering, electroforming, and evaporation.

10. The method according to claim 6, wherein said one or more second small form factor manufacturing processes comprises at least one of dip coating, spin coating, doctored blade, spray coating, screen printing, sputtering, glass mastering, photoresist mastering, electroforming, and evaporation.

11. The method according to claim 6, wherein said organic lighting device is one of a White Organic Light Emitting Diode (WOLED), an Active-matrix Organic Light Emitting Diodes (AMOLED), a Passive-matrix Organic Light Emitting Diodes (PMOLED), a Flexible Organic Light Emitting Diodes (FOLED), a Stacked Organic Light Emitting Diodes (SOLED), a Tandem Organic Light Emitting Diode , a Transparent Organic Light Emitting Diodes (TOLED), a Top Emitting Organic Light Emitting Diode, a Bottom Emitting Organic Light Emitting Diode, a Fluorescence doped Organic Light Emitting Diode (F-OLED), a Phosphorescent Organic Light Emitting Diode (PHOLED).

12. The method according to claim 6, wherein said one or more first small form factor manufacturing processes are and said one or more second small form manufacturing processes are a batch process.

13. A method of manufacturing an organic lighting device of form factor less than or equal to 30 cm×30 cm, said method comprising
high throughput first processing of one or more first product sized substrates employing one or more first small form factor manufacturing processes;
active layer deposition processing of said one or more first product sized substrates, wherein said active layer deposition processing is a batch process;
high throughput second processing of one or more second product sized substrates employing one or more second small form factor manufacturing processes; and
encapsulating at least one of said one or more first product sized substrates with at least one of said one or more second product sized substrates to form said organic lighting device, wherein said method of manufacturing said organic lighting device does not involve a cutting process.

14. The method according to claim 13 is conventionally optimized to meet a required production rate with a minimum of idle time between processes.

15. The method according to claim 13 further comprising a step of connecting one or more said organic lighting device to form a large organic lighting device of a large form factor, such that optical output of said large organic lighting device is optimized.

16. The method according to claim 13, wherein said form factor of said organic lighting device is customizable based on a requirement of a user, said form factor of said organic lighting device is a multiple of at least one of a first pre-defined form factor dimension and a second pre-defined form factor dimension.

17. The method according to claim 13, wherein said one or more first small form factor manufacturing processes is selected from a group comprising dip coating, spin coating, doctored blade, spray coating, screen printing, sputtering, glass mastering, photoresist mastering, electroforming, and evaporation.

18. The method according to claim 13, wherein said one or more second small form factor manufacturing processes is selected from a group comprising dip coating, spin coating, doctored blade, spray coating, screen printing, sputtering, glass mastering, photoresist mastering, electroforming, and evaporation.

19. The method according to claim 13, wherein said organic lighting device is selected from a group consisting of Organic Light Emitting Diode (OLED), White Organic Light Emitting Diode (WOLED), Active-matrix Organic Light Emitting Diodes (AMOLED), Passive-matrix Organic Light Emitting Diodes (PMOLED), Flexible Organic Light Emitting Diodes (FOLED), Stacked Organic Light Emitting Diodes (SOLED), Tandem Organic Light Emitting Diode , Transparent Organic Light Emitting Diodes (TOLED), Top Emitting Organic Light Emitting Diode, Bottom Emitting Organic Light Emitting Diode, Fluorescence doped Organic Light Emitting Diode (F-OLED), Phosphorescent Organic Light Emitting Diode (PHOLED).

20. The method according to claim 13, wherein said one or more first small form factor manufacturing processes and said second small form factor manufacturing processes are a batch process.

* * * * *